United States Patent
Shaeffer et al.

(10) Patent No.: US 8,567,246 B2
(45) Date of Patent: Oct. 29, 2013

(54) INTEGRATED MEMS DEVICE AND METHOD OF USE

(75) Inventors: Derek Shaeffer, Redwood City, CA (US); Baris Cagdaser, Sunnyvale, CA (US); Chiung C. Lo, Campbell, CA (US); Joseph Seeger, Menlo Park, CA (US)

(73) Assignee: Invensense, Inc., San Jose, CA (US)

( * ) Notice: Subject to any disclaimer, the term of this patent is extended or adjusted under 35 U.S.C. 154(b) by 365 days.

(21) Appl. No.: 12/979,960

(22) Filed: Dec. 28, 2010

(65) Prior Publication Data

US 2012/0086446 A1 Apr. 12, 2012

Related U.S. Application Data

(60) Provisional application No. 61/392,412, filed on Oct. 12, 2010.

(51) Int. Cl.
*G01C 19/56* (2012.01)

(52) U.S. Cl.
USPC ..................................... 73/504.12

(58) Field of Classification Search
USPC ............... 73/504.04, 504.12, 504.14, 504.16, 73/514.32, 510, 511
See application file for complete search history.

(56) References Cited

U.S. PATENT DOCUMENTS

| | | | |
|---|---|---|---|
| 3,728,090 A | 4/1973 | Hoffman et al. | |
| 5,083,466 A | 1/1992 | Holm-Kennedy et al. | |
| 5,249,732 A | 10/1993 | Thomas | |
| 5,359,893 A | 11/1994 | Dunn | |
| 5,367,194 A | 11/1994 | Beatty | |
| 5,426,070 A | 6/1995 | Shaw et al. | |
| 5,481,914 A * | 1/1996 | Ward | 73/504.16 |
| 5,485,032 A | 1/1996 | Schepis et al. | |
| 5,656,778 A | 8/1997 | Roszhart | |
| 5,659,195 A | 8/1997 | Kaiser et al. | |
| 5,693,574 A | 12/1997 | Schuster et al. | |
| 5,703,293 A | 12/1997 | Zabler et al. | |
| 5,780,740 A | 7/1998 | Lee et al. | |
| 5,895,850 A | 4/1999 | Buestgens | |
| 5,915,168 A | 6/1999 | Salatino et al. | |
| 5,992,233 A | 11/1999 | Clark | |
| 5,996,409 A | 12/1999 | Funk et al. | |
| 6,036,872 A | 3/2000 | Wood et al. | |
| 6,122,961 A | 9/2000 | Geen et al. | |
| 6,128,961 A | 10/2000 | Haronian | |

(Continued)

FOREIGN PATENT DOCUMENTS

| | | |
|---|---|---|
| WO | WO 02/42716 | 5/2002 |
| WO | WO 03/038449 | 5/2003 |

OTHER PUBLICATIONS

Bao Vu, et al., "Patterned eutectic bonding with Al/Ge thin films for microelectromechanical systems," May 31, 1996, pp. 2588-2594.

(Continued)

*Primary Examiner* — Helen Kwok
(74) *Attorney, Agent, or Firm* — Sawyer Law Group, P.C.

(57) ABSTRACT

An integrated MEMS device is disclosed. The system comprises a MEMS resonator; and a MEMS device coupled to a MEMS resonator. The MEMS resonator and MEMS device are fabricated on a common substrate so that certain characteristics of the MEM resonator and MEMS device track each other as operating conditions vary.

18 Claims, 3 Drawing Sheets

(56) References Cited

U.S. PATENT DOCUMENTS

| | | | |
|---|---|---|---|
| 6,153,917 A | 11/2000 | Matsunaga et al. | |
| 6,189,381 B1 | 2/2001 | Huang et al. | |
| 6,199,748 B1 | 3/2001 | Zhu et al. | |
| 6,229,190 B1 | 5/2001 | Bryzek et al. | |
| 6,250,157 B1 | 6/2001 | Touge | |
| 6,391,673 B1 | 5/2002 | Ha et al. | |
| 6,426,687 B1 | 7/2002 | Osborn | |
| 6,430,998 B2 | 8/2002 | Kawai et al. | |
| 6,433,411 B1 | 8/2002 | Degani et al. | |
| 6,448,109 B1 | 9/2002 | Karpman | |
| 6,452,238 B1 | 9/2002 | Orcutt et al. | |
| 6,479,320 B1 | 11/2002 | Gooch | |
| 6,480,320 B2 | 11/2002 | Nasiri | |
| 6,481,283 B1 | 11/2002 | Cardarelli | |
| 6,481,284 B2 | 11/2002 | Geen et al. | |
| 6,481,285 B1 | 11/2002 | Shkel et al. | |
| 6,487,908 B2 | 12/2002 | Geen et al. | |
| 6,508,122 B1 | 1/2003 | McCall et al. | |
| 6,513,380 B2 | 2/2003 | Reeds, III et al. | |
| 6,519,075 B2 | 2/2003 | Carr et al. | |
| 6,528,344 B2 | 3/2003 | Kang | |
| 6,528,887 B2 | 3/2003 | Daneman et al. | |
| 6,533,947 B2 | 3/2003 | Nasiri et al. | |
| 6,555,417 B2 | 4/2003 | Spooner et al. | |
| 6,559,530 B2 | 5/2003 | Hinzel et al. | |
| 6,621,137 B1 | 9/2003 | Ma et al. | |
| 6,635,509 B1 | 10/2003 | Ouellet | |
| 6,650,455 B2 | 11/2003 | Miles | |
| 6,660,564 B2 | 12/2003 | Brady | |
| 6,686,639 B1 | 2/2004 | Tsai | |
| 6,770,569 B2 | 8/2004 | Foerstner et al. | |
| 6,794,272 B2 | 9/2004 | Turner et al. | |
| 6,796,178 B2 | 9/2004 | Jeong et al. | |
| 6,808,955 B2 | 10/2004 | Ma | |
| 6,852,926 B2 | 2/2005 | Ma et al. | |
| 6,892,575 B2 | 5/2005 | Nasiri et al. | |
| 6,918,297 B2 | 7/2005 | MacGugan | |
| 6,936,491 B2 | 8/2005 | Partridge et al. | |
| 6,936,494 B2 | 8/2005 | Cheung | |
| 6,939,473 B2 | 9/2005 | Nasiri et al. | |
| 6,943,484 B2 * | 9/2005 | Clark et al. | 310/334 |
| 7,004,025 B2 | 2/2006 | Tamura | |
| 7,028,547 B2 | 4/2006 | Shiratori et al. | |
| 7,104,129 B2 | 9/2006 | Nasiri et al. | |
| 7,196,404 B2 | 3/2007 | Schirmer et al. | |
| 7,247,246 B2 * | 7/2007 | Nasiri et al. | 216/2 |
| 7,642,692 B1 * | 1/2010 | Pulskamp | 310/309 |
| 7,907,838 B2 * | 3/2011 | Nasiri et al. | 396/55 |
| 8,220,330 B2 * | 7/2012 | Miller et al. | 73/514.32 |
| 8,236,577 B1 * | 8/2012 | Hsu et al. | 438/3 |
| 2002/0051258 A1 | 5/2002 | Tamura | |
| 2003/0074967 A1 | 4/2003 | Tang et al. | |
| 2003/0110858 A1 | 6/2003 | Kim et al. | |
| 2003/0164041 A1 | 9/2003 | Jeong et al. | |
| 2004/0055380 A1 | 3/2004 | Shceglov et al. | |
| 2005/0081633 A1 | 4/2005 | Nasiri et al. | |
| 2005/0170656 A1 | 8/2005 | Nasiri et al. | |

OTHER PUBLICATIONS

Sumant Sood, et al., "Al-Ge Eutectic Wafer Bonding and Bond Characterization for CMOS Compatible Wafer Packaging", SVTC Technologies, May 8, 2010, pp. 1-8.

Supplementary European Search Report dated Jul. 20, 2010, application No. 06737697.0-1528/ 1859475, PCT/US2006008543 (3404EP).

Amendment filed Feb. 14, 2011, in European Patent Application No. 06737697.0-1528 (3404EP).

Notification of Transmittal of the International Search Report and the Written Opinion of the International Searching Authority or the Declaration, issued in International Application No. PCT/US06/44919 (3401C-CIP-PCT), Feb. 7, 2008.

* cited by examiner

INTEGRATED MEMS DEVICE AND METHOD OF USE

FIELD OF THE INVENTION

The present invention relates generally to MEMS devices and more specifically to an integrated MEMS device.

RELATED APPLICATIONS

U.S. Pat. No. 6,892,575, entitled "X-Y Axis Dual-Mass Tuning Fork Gyroscope with Vertically Integrated Electronics and Wafer-Scale Hermetic Packaging," issued May 17, 2005;

U.S. Pat. No. 6,939,473, entitled "Method of Making an X-Y Axis Dual-Mass Tuning Fork Gyroscope with Vertically Integrated Electronics and Wafer-Scale Hermetic Packaging," issued Sep. 6, 2005;

U.S. Pat. No. 7,104,129, entitled "Vertically Integrated MEMS Structure," issued Sep. 12, 2006;

U.S. Pat. No. 7,247,246, entitled "Vertical Integration of a MEMS Structure with Electronics in a Hermetically Sealed Cavity," issued Jul. 24, 2007;

U.S. Pat. No. 7,442,570, entitled "Method of Fabrication of Al/GE Bonding in a Wafer Packaging Environment and a Product Produced Therefrom," issued Oct. 28, 2008;

U.S. patent application Ser. No. 12/184,231, entitled "Method of Fabrication of Al/GE Bonding in a Wafer Packaging Environment and a Product Produced Thereupon," filed on Jul. 31, 2008 and assigned to the assignee of the present invention;

All of which are incorporated herein by reference in their entireties.

BACKGROUND OF THE INVENTION

There are many types of MEMS devices that may require accurate timebases. For example, inertial sensors may produce outputs corresponding to measurements of acceleration, velocity or heading at a prescribed sample rate. Accurate interpretation of such outputs will impose requirements on the tolerance of the sample rate, which is ultimately related to the timebase accuracy. For example, an application of an inertial sensor may make use of velocity measurements to perform a calculation of a change in position. Such calculations require integration and any tolerance in the sensor sample rate will translate into a corresponding tolerance in the calculation of position.

There are many types of integrated timebases known in the art. They include R-C oscillators, L-C oscillators, and the like which are based on passive components. Such oscillators typically exhibit high noise and large frequency tolerance. In addition, the operation of these types of oscillators cannot be made to correspond to the characteristics of the MEMS device according to changes in the manufacturing process, voltage and temperature. Accordingly, what is needed is a method and system for providing an integrated timebase for a MEMS device that overcomes the above identified issues. The system and method should be efficient, cost effective and adaptable to existing environments. The present invention addresses such a need.

SUMMARY OF THE INVENTION

An integrated MEMS device is disclosed. The integrated MEMS device comprises a MEMS resonator; and a MEMS device coupled to a MEMS resonator. The MEMS resonator and MEMS device are fabricated on a common substrate so that certain characteristics of the MEMS resonator and MEMS device track each other as operating conditions vary.

DETAILED DESCRIPTION

Figure 2:
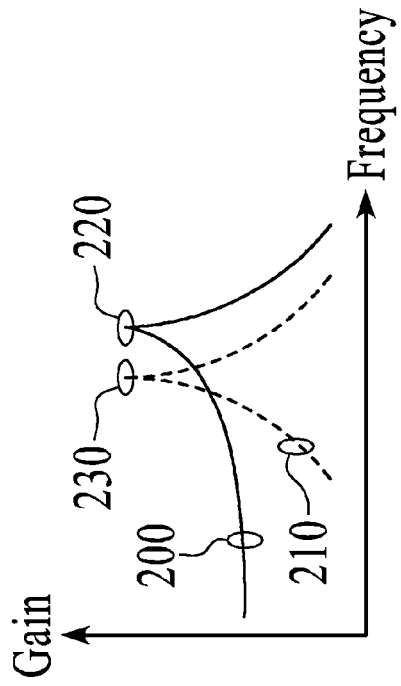
FIG. 2 shows that the aforementioned MEMS device may possess a gain versus frequency characteristic exhibiting a gain peak.

The present invention relates generally to MEMS devices and more specifically to an integrated MEMS device. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Accurate timebases are a feature of many electronic systems. Commonly, an accurate timebase comprises two components: a resonator element which is an element providing energy storage at a resonance frequency, and an oscillator which provides energy to the resonator causing an oscillation to occur at or near the resonance frequency. High quality timebases are usually characterized as having high frequency and phase stability, according to the requirements of a given application. These qualities depend in large part on the characteristics of the resonator element, particularly the stability of its resonance frequency over temperature, supply and manufacturing variations, and its ability to retain the energy supplied to it by the oscillator with minimal energy lost per oscillation cycle. The ratio of energy storage to energy lost per oscillation cycle is commonly called the quality factor or "Q" of the resonator, and a high Q is usually desirable for making an accurate timebase. These concepts of timebase design are well known in the art and would be familiar to one of ordinary skill in the design of resonators and oscillators.

A resonator of particular interest with respect to the present invention is a MEMS resonator. This type of resonator is formed using micromachining techniques and comprises mechanical elements such as masses, springs and dampers to form a resonant element. An example of a process for fabricating micromachined elements may be found in the Nasiri fabrication process disclosed in U.S. Pat. No. 7,442,570, which is assigned to the assignee of the present application and is incorporated in its entirety herein.

There are many types of MEMS devices that may require accurate timebases. For example, inertial sensors may produce outputs corresponding to measurements of acceleration, angular velocity or heading at a prescribed sample rate. Accurate interpretation of such outputs will impose requirements on the tolerance of the sample rate, which is ultimately related to the timebase accuracy. For example, an application of an inertial sensor may make use of velocity measurements to perform a calculation of a change in position. Such calculations require integration and any tolerance in the sensor sample rate will translate into a corresponding tolerance in the calculation of position. To the extent that MEMS resonators form a basis for more accurate timebases, it would be advantageous to combine a MEMS resonator with other types of MEMS devices in an integrated solution.

There are other types of MEMS devices requiring timebases with characteristics that track corresponding characteristics of the MEMS device. For example, a magnetometer may operate at a frequency corresponding to a natural resonance of the sensor. The natural resonance may be subject to variations due to changing operating conditions such as voltage or temperature variation. The sensor may require a driving system whose operating frequency is subject to similar voltage or temperature dependence. It would therefore be advantageous to have a MEMS-based timebase with characteristics that track corresponding characteristics of the magnetometer. By using such a timebase, the magnetometer operating frequency would be made to track the variation in the magnetometer natural resonance frequency and thereby maintain performance as operating conditions drift.

Figure 1:
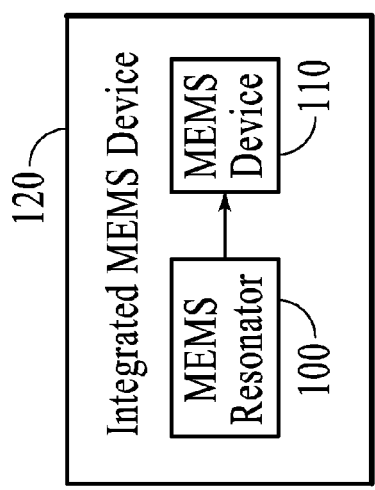
FIG. 1 shows an embodiment of the present invention.

An embodiment of the present invention is illustrated in FIG. 1. In this embodiment, a MEMS resonator (100) is coupled to a MEMS device (110) in an integrated MEMS device (120). The integration of a MEMS resonator with a MEMS device in an integrated MEMS device carries several advantages. An example of an integrated MEMS device is a system wherein the MEMS device and the MEMS resonator are fabricated on the same substrate. One of ordinary skill in the art readily recognizes that an integrated MEMs device could include a variety of MEMS devices on the same substrate and that system would be within the spirit and scope of the present invention. For example, the MEMS substrate could be fabricated in accordance with the aforementioned Nasiri fabrication process disclosed in U.S. Pat. No. 7,442,570.

In the above-identified patent, a method of fabrication of a wafer level package is disclosed. The method comprises providing a MEMS structure including a substantially germanium top layer, and providing a CMOS structure including a substantially aluminum top layer. Finally, the method comprises bonding the top layer of the MEMS structure with the top layer of the CMOS structure.

In an embodiment, the standard foundry CMOS wafer which includes aluminum is bonded to the germanium on the MEMS structure to provide an aluminum/germanium (Al/Ge) bond. In this embodiment, a cavity is within the substrate. The CMOS substrate wafer can be any substrate with patterned aluminum that is designed to interface with the MEMS substrate to make for a complete functioning product. For example, any active circuitry designed to stimulate the MEMS structure or to receive or process signals from the MEMS structure may reside in the CMOS substrate wafer.

Accordingly, this or any similar process can be utilized to fabricate a MEMS resonator and a MEMS device on the same substrate.

In an embodiment, the MEMS resonator may form the basis of a timebase for the MEMS device that has superior characteristics when compared to alternative integrated timebases that are well known in the art. Examples of alternative integrated timebases include R-C oscillators and L-C oscillators, which employ passive electrical components as resonators. Such oscillators typically exhibit high noise and large frequency tolerance when compared to MEMS resonator based oscillators. Thus, the integration of a MEMS resonator with a MEMS device allows for the operation of that device with a lower noise and smaller frequency tolerance than is available with alternative techniques.

In addition, a MEMS resonator integrated with a MEMS device can be made to possess characteristics corresponding to the MEMS device in beneficial ways. For example, with reference to FIG. 2, the aforementioned MEMS device may possess a gain versus frequency characteristic (200) exhibiting a gain peak (220). To achieve high gain, it is advantageous to operate the MEMS device at a frequency near the gain peak (220). One method of achieving such operation would be to construct a resonator with gain versus frequency characteristic (210) possessing a gain peak (230) positioned in proximity to the gain peak (220). However, a MEMS device may exhibit frequency shifts according to changes in manufacturing process, voltage and temperature that may be large enough to cause gain peak (220) to shift away from resonator peak (230) so that the desired proximity cannot be maintained over realistic operating conditions. Thus, it would be advantageous to construct a resonator employing a MEMS resonator possessing sensitivity to variations in manufacturing process, voltage and temperature that substantially match the corresponding sensitivities of the MEMS device. This may be achieved by constructing a MEMS resonator with like elements that may exhibit variations similar to the MEMS device.

Figure 3:
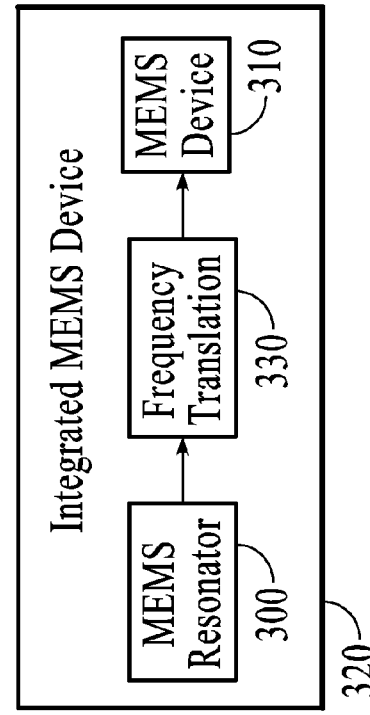
FIG. 3 shows an alternative embodiment of the present invention.

An alternative embodiment of the present invention is shown in FIG. 3. In this embodiment, an integrated MEMS device (320) comprises a MEMS resonator (300) coupled to a frequency translation circuit (330), wherein the frequency translation circuit (330) is further coupled to a MEMS device (310). This arrangement is advantageous in that the MEMS resonator and MEMS device operating frequencies may be optimized individually with the frequency translation circuit performing a frequency conversion between the two.

Figure 4:
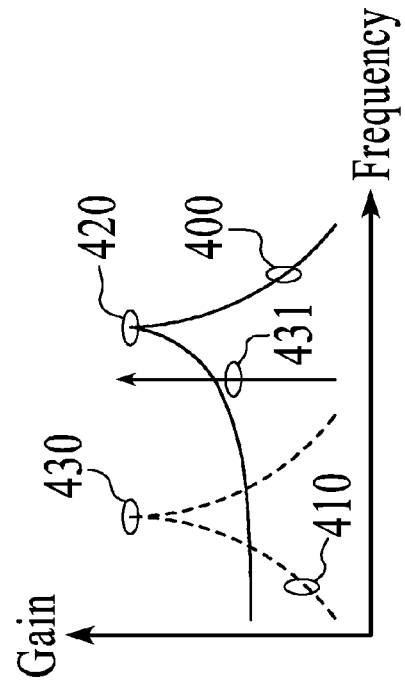
FIG. 4 shows that the aforementioned MEMS resonator may possess a gain versus frequency characteristic with a gain peak that is separated from a desired operating frequency.

With reference to FIG. 4, the aforementioned MEMS resonator may possess a gain versus frequency characteristic (410) with gain peak (430) that is separated from desired operating frequency (431). The frequency translation circuit translates the resonator frequency corresponding to gain peak (430) to the desired operating frequency (431). Provided that the frequency translation circuit provides a frequency offset that is substantially independent of operating conditions such as voltage and temperature, the operating frequency (431) will substantially track any variations in the MEMS resonator frequency (430) that occur due to changing operating conditions.

An advantage of this arrangement is that manufacturing variations can be accommodated by trimming the frequency translation to align operating frequency (431) to position it optimally with respect to MEMS device gain versus frequency characteristic (400) peak (420). This relaxes the requirements on the MEMS resonator design so that it only need track the MEMS device over voltage and temperature, but not manufacturing variation.

The examples noted here should not be interpreted to restrict the range of possible gain characteristics of the MEMS device. In general, a MEMS device may possess any number of gain peaks and other features in its gain versus frequency characteristic. An advantage of the present invention is the ability to substantially align an operating frequency with a MEMS device gain characteristic so that performance is optimized and this performance may be substantially maintained over changing operating conditions and over variations in manufacturing process.

Figure 5:
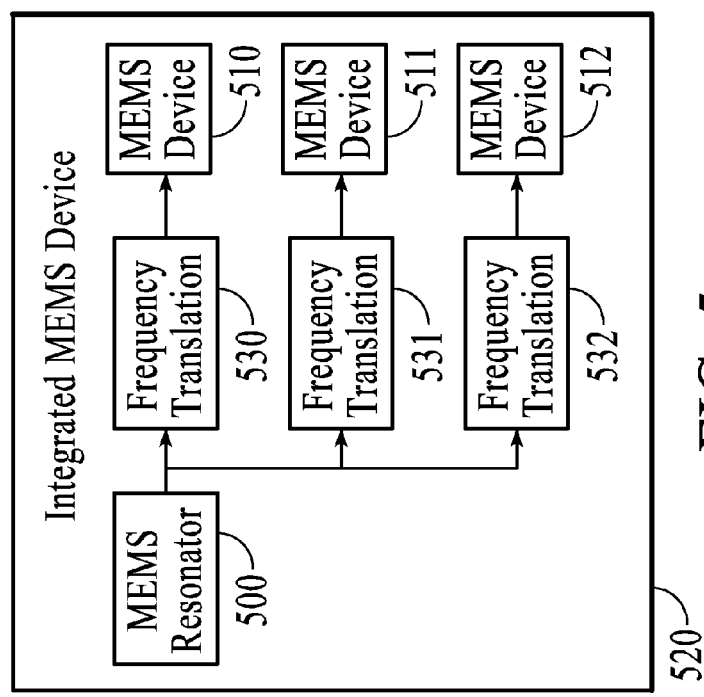
FIG. 5 shows an alternative embodiment of the present invention.

Another embodiment of the present invention is shown in FIG. 5. In this embodiment, multiple frequency translation circuits (530), (531) and (532) are employed to couple a MEMS resonator (500) to multiple MEMS devices (510), (511) and (512). By this arrangement, multiple MEMS devices with differing gain characteristics and desired operating frequencies are accommodated without requiring the use of multiple MEMS resonators (500). For example, the multiple MEMS devices (510), (511) and (512) might correspond to multiple sensors with different orientations in a multi-axis sensor. It is often the case that different orientations may require different desired operating frequencies. In another example, the multiple MEMS devices (510), (511) and (512) might correspond to multiple types of sensors possibly in multiple orientations. Sensors of different types may generally require different desired operating frequencies. These embodiments would be well-served by employing multiple frequency translation circuits as shown.

Figure 6:
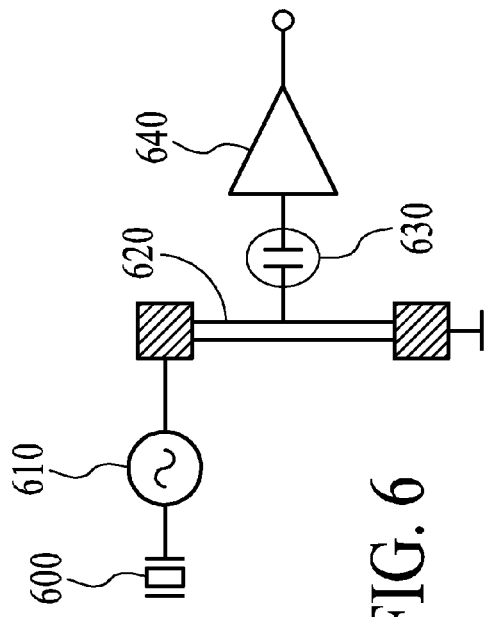
FIG. 6 shows an alternative embodiment of the present invention.

An alternative embodiment of the present invention is illustrated in FIG. 6. In this embodiment, a MEMS resonator (600) possessing a gain peak (230) is coupled to an oscillator circuit (610) that oscillates at a frequency substantially equal to the resonator gain peak. The oscillator circuit (610) is coupled to a MEMS device comprising a flexible beam (620) possessing a MEMS device resonance (220) and causes a current to flow in the beam. In the presence of an external magnetic field, deflection of the beam (620) may occur due to the Lorentz force acting on the beam current. This force will be applied to the beam (620) at the oscillation frequency of the current. The beam (620) will respond to the Lorentz force by deflecting by an amount related to its MEMS device gain characteristic (200). The beam (620) is coupled to sense amplifier (640) by use of a coupling capacitor (630). The deflection of the beam (620) causes a change in capacitance (630) and this change is sensed by sense amplifier (640) to produce an output signal proportional to the applied magnetic field. In this way, a Lorentz force magnetometer may be realized. As previously described, it is advantageous for MEMS resonator (600) and MEMS device (620) to be integrated together in an integrated MEMS device. By doing so, the MEMS resonator resonance (230) and the MEMS device resonance (220) can be brought into proximity and the desired proximity better maintained over operating conditions by virtue of the similarity of the MEMS resonator (600) and MEMS device (620). A further advantage is that the MEMS resonator (600) can provide a high-quality oscillation for the magnetometer enabling more accurate, lower-noise magnetic field measurements.

It is understood that the integrated MEMS device (320) illustrated in FIG. 3 may also be applied to construct a Lorentz force magnetometer. A frequency translation circuit (330) may be incorporated into the magnetometer of FIG. 6 such that the output frequency of oscillator (610) would be frequency translated and then applied to the MEMS Device (620). Doing so would allow the desired proximity of the current oscillation frequency to the MEMS device resonance to be maintained even if the MEMS resonator (600) operates at a different frequency.

Figure 7:
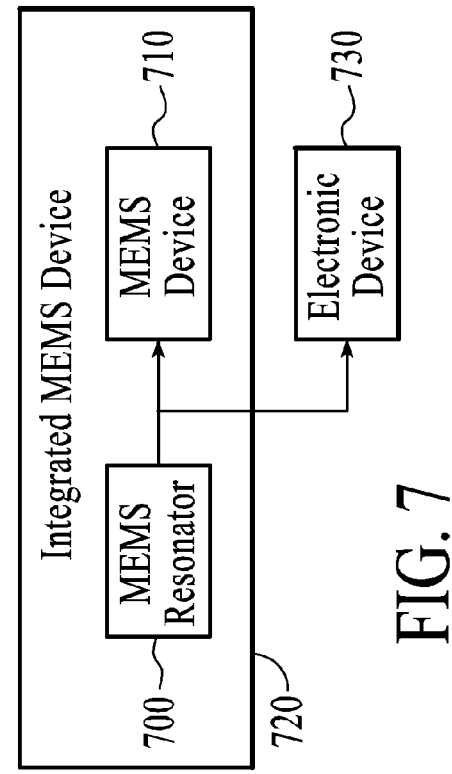
FIG. 7 shows another embodiment of the present invention.

Another embodiment of the present invention is shown in FIG. 7. In this embodiment, a MEMS resonator (700) is coupled to a MEMS device (710) in an integrated MEMS device (720). The MEMS resonator (700) is further coupled to an electronic device (730). This arrangement is advantageous in that the MEMS resonator serves dual-purposes of actuating the MEMS device (700) and providing a timebase to the electronic device (730). This arrangement is useful in many cases, as the electronic circuits used for MEMS devices often benefit from accurate timebases. Inertial sensors are one class of MEMS devices benefitting from stable timebases.

Figure 8:
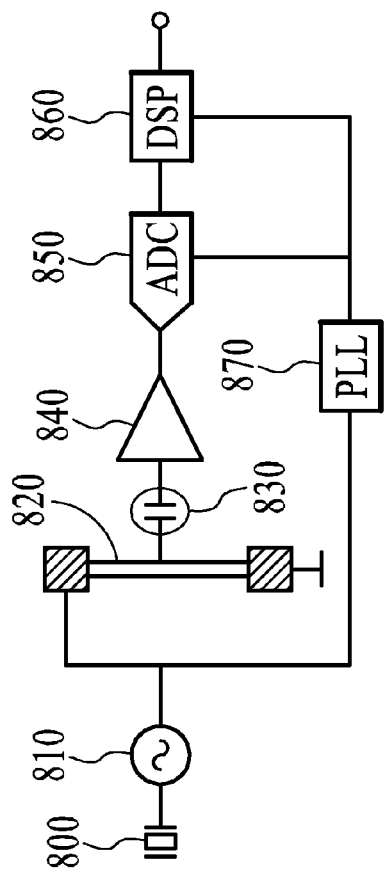
FIG. 8 shows an alternative embodiment of the present invention.

An embodiment of the present invention illustrating the coupling of the MEMS resonator to an electronic device thereby providing a timebase for the electronic device is shown in FIG. 8. In this embodiment, a MEMS resonator (800) is coupled to an oscillator (810), which in turn is coupled to a MEMS device comprising a flexible beam (820). The oscillator (810) drives a current through the beam (820) and the beam (820) is configured to deflect in response to an applied magnetic field according to the Lorentz force acting on the current flowing in the beam (820). The beam (820) is coupled to a sense amplifier (840) by means of a capacitance element (830) whose capacitance changes according to the amount of deflection of the beam (820). The sense amplifier (840) amplifies this change in capacitance. The resulting signal is digitized by analog-to-digital converter (850) and then further processed by digital signal processor (860). The analog-to-digital converter (850) and digital signal processor (860) both employ a clock provided by phase-locked loop (870). The phase-locked loop (870) uses the output of oscillator (810) as a reference clock. By this arrangement, a digital Lorentz force magnetometer may be realized. The MEMS resonator (800) and the oscillator (810) serve as the source of the beam current drive of the MEMS device (820) as well as providing an accurate timebase for digitization of the sensor output.

Figure 9:
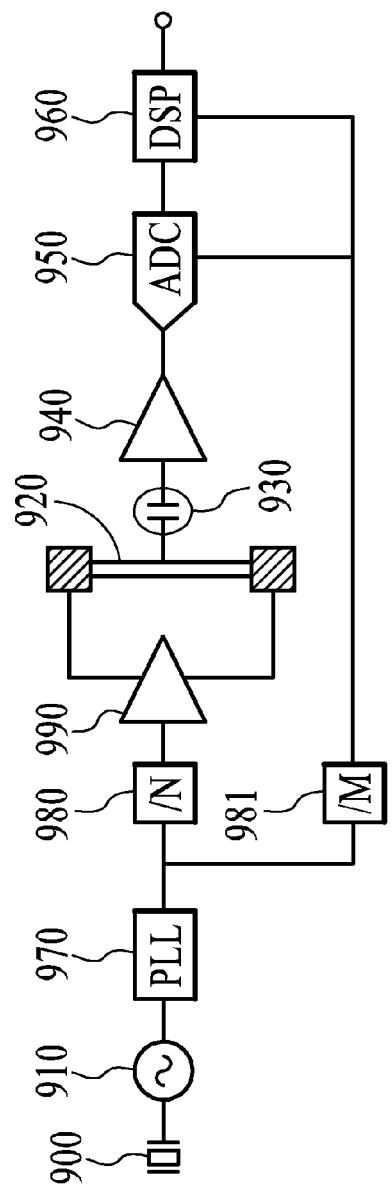
FIG. 9 shows an embodiment of the present invention incorporating frequency translation.

It is understood that the integrated MEMS device (720) illustrated in FIG. 7 may further incorporate a frequency translation such as the frequency translation (330) illustrated in FIG. 3. An embodiment of the present invention incorporating such a frequency translation is shown in FIG. 9. This embodiment is similar to the embodiment shown in FIG. 8, except that the output of the oscillator (910) is coupled to a phase-locked loop (970), whose output is then coupled to frequency dividers (980) and (981). The output of divider (980) is coupled to a drive amplifier (990) and the output of the drive amplifier (990) is coupled to the MEMS device comprising a flexible beam (920). In this embodiment, the drive amplifier (990) supplies a differential drive to the flexible beam (920) by driving both ends of the beam. The use of phase-locked loop (970) and frequency divider (980) permits a frequency translation to be performed on the oscillator (910) output signal prior to generation of the beam (920) current.

As described previously with reference to FIG. 4, this arrangement allows the production of a signal with a desired operating frequency (431) in proximity to a gain peak (420) of the MEMS device. In the embodiment of FIG. 9, the gain peak is understood to be a peak in the MEMS device (920) deflection in response to the Lorentz force acting on the current flowing in the beam (920). This embodiment is advantageous in that the resonance frequency (430) of the MEMS resonator (900) may be chosen to be different from the desired operating frequency (431), which provides a helpful degree of freedom for optimizing the design. A further advantage is that the phase-locked loop (970) and the divider (980) may be adjusted after production of the integrated MEMS device to compensate for manufacturing variations and maintain proper alignment of the frequency of signal (431) with respect to the MEMS device gain peak (420).

The embodiment of FIG. 9 also couples the output of phase-locked loop (970) to a second frequency divider (981), whose output is then coupled to an analog-to-digital converter (950) and digital signal processor (960). By this arrangement, the operating frequency of the analog-to-digital converter (950) and a digital signal processor (960) may be chosen independently of either the MEMS resonator (900) resonance frequency (430) or desired operating frequency (431).

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An integrated MEMS system comprising:
    a MEMS resonator; and
    at least one MEMS device coupled to the MEMS resonator, wherein the MEMS resonator and the at least one MEMS device are fabricated on a common substrate, wherein a gain peak of the MEMS resonator tracks with an offset with respect to a gain peak of the at least one MEMS device to optimize the performance of the at least one MEMS device.

2. The system of claim 1, wherein the MEMS resonator is coupled to an electronic circuit.

3. The system of claim 1, which further includes at least one frequency translation circuit coupled between the MEMS resonator and the at least one MEMS device.

4. The system of claim 3, a gain peak of the MEMS resonator being translated by a frequency offset provided by the frequency translation circuit to achieve alignment with respect to a gain peak of the MEMS device to optimize the at least one MEMS device performance.

5. The system of claim 3, wherein the at least one frequency translation circuit comprises a plurality of frequency translation circuits and the at least one MEMS device comprises a plurality of MEMS devices.

6. A MEMS Lorentz-force magnetometer system comprising:
    a MEMS resonator;
    an oscillator coupled to the MEMS resonator; and
    a MEMS device coupled to the oscillator, wherein the MEMS resonator and the MEMS device are fabricated on a common substrate, wherein a gain peak of the MEMS resonator tracks with an offset with respect to a gain peak of the at least one MEMS device to optimize the performance of the at least one MEMS device;
    the MEMS device further comprising a flexible element, the oscillator operable to produce an oscillation substantially at a resonant frequency of the MEMS resonator, the oscillator operable to drive a current in the flexible element, the flexible element operable to deflect in response to a Lorentz force.

7. The system of claim 6 which further comprises a capacitance coupled to the flexible element, and a sense amplifier coupled to the capacitance; the capacitance operable to change in response to the deflection of the flexible element, and the sense amplifier operable to amplify a capacitance change.

8. The system of claim 6, wherein the flexible element comprises a flexible beam.

9. The system of claim 6, wherein the MEMS resonator is further coupled to an electronic circuit other than the oscillator.

10. The system of claim 9, wherein the electronic circuit comprises a digital signal processor.

11. The system of claim 9, wherein the electronic circuit comprises:
    an analog to digital converter (ADC) coupled to a sense amplifier;
    a digital signal processor (DSP) coupled to the ADC; and
    a phase locked loop (PLL) coupled to the ADC, the DSP and the oscillator.

12. The system of claim 6, which further includes at least one frequency translation circuit coupled between the oscillator and the MEMS resonator.

13. The system of claim 12, wherein the at least on frequency translation circuit comprises a phase locked loop (PLL).

14. The system of claim 6, wherein the MEMS resonator comprises a gyroscope.

15. A method comprising:
    fabricating a MEMS resonator and at least one MEMS device on a common substrate at substantially the same time, wherein there is a correlation between at least one characteristic of the MEMs resonator and at least one characteristic of the MEMS device, wherein the step of fabricating is effective to substantially track with an offset a gain peak of the MEMS resonator with respect to a gain peak of the at least one MEMS device to optimize the performance of the at least one MEMS device.

16. The method of claim 15 further comprising translating at least one frequency corresponding to a gain peak of the MEMS resonator between the MEMS resonator and the at least one MEMS device.

17. The method of claim 16, wherein the step of translating the at least one frequency is effective to substantially align the at least one frequency with respect to a gain peak of the at least one MEMS device.

18. The method of claim 16, wherein the step of translating the at least one frequency comprises translating a plurality of frequencies and the at least one MEMS device comprises a plurality of MEMS devices, wherein the plurality of MEMS devices receives the plurality of frequency translations.

* * * * *